United States Patent [19]

Lain et al.

[11] Patent Number: 5,079,452

[45] Date of Patent: Jan. 7, 1992

[54] HIGH SPEED ECL LATCH WITH CLOCK ENABLE

[75] Inventors: Raymond S. Lain, Ashland; Daniel F. Hopta, Bolton, both of Mass.

[73] Assignee: Digital Equipment Corporation, Maynard, Mass.

[21] Appl. No.: 546,579

[22] Filed: Jun. 29, 1990

[51] Int. Cl.$^5$ .................... H03K 17/60; H03K 19/086
[52] U.S. Cl. .................... 307/480; 307/467; 307/240; 307/254
[58] Field of Search ............... 307/455, 467, 480, 494, 307/239, 240, 253, 254

[56] References Cited

U.S. PATENT DOCUMENTS

| | | | |
|---|---|---|---|
| 3,906,212 | 9/1975 | Poguntke | 235/176 |
| 4,408,134 | 10/1983 | Allen | 307/471 |
| 4,540,900 | 9/1985 | Early et al. | 307/455 X |
| 4,551,639 | 11/1985 | Takeda et al. | 307/455 |
| 4,560,888 | 12/1985 | Oida | 307/272 |
| 4,607,172 | 8/1986 | Frederiksen et al. | 307/291 |
| 4,626,709 | 12/1986 | Mazumder et al. | 307/455 |
| 4,686,394 | 8/1987 | Lam | 307/455 |
| 4,754,173 | 6/1988 | Smith et al. | 307/455 |
| 4,777,388 | 10/1988 | Widener | 307/272.2 |
| 4,900,954 | 2/1990 | Franz et al. | 307/455 |

*Primary Examiner*—David Mis
*Attorney, Agent, or Firm*—Kenyon & Kenyon

[57] ABSTRACT

An ECL latch having a clock enable is provided with a first current source for the latch and a second current source for the clock enable. The latch alternates between a latch mode and a transparent mode under the control of a CLOCK signal. The clock enable operates to inhibit CLOCK signal control of the latch and holds the latch in the latch mode when an appropriate enable signal is applied to the clock enable. A current switch is provided to gate current from the second current source to the latch so that current from both current sources is gated to the latch during the transparent mode when the CLOCK signal controls latch operation. In this manner, the speed of operation of the latch during the transparent mode is increased. Thus, the latch will have an improved propagation delay to permit latch operation with a smaller clock period for a given supply current.

9 Claims, 3 Drawing Sheets

HIGH SPEED ECL LATCH WITH CLOCK ENABLE

FIELD OF THE INVENTION

The present invention is directed to a latch circuit and, more particularly, to a bipolar integrated circuit design for a high speed computer latch circuit having a clock enable input and utilizing emitter-coupled logic (ECL).

BACKGROUND OF THE INVENTION

A latch with clock enable is a standard logic circuit used in the design of various digital logic systems including, but not limited to, computer systems. A latch is a data storage element used to hold a given logic state when a CLOCK input to the latch is switched to an appropriate state, commonly referred to as a latch mode. When the CLOCK input is switched to an opposite state, the latch operates to transmit a logic value at its data input directly to its output. This is commonly referred to as a transparent mode.

Emitter coupled logic is a known circuit design method using bipolar junction transistors coupled together to form a differential amplifier. Generally, the emitters of parallel transistors are coupled to one another and the transistors are biased so that the transistor having sufficiently more positive voltage applied to its base will draw all of the current flow through the differential amplifier circuit and hence, function as a current switch. Multiple differential amplifiers can be arranged in various logic levels to provide logic functions, as for example, a latch.

In an ECL latch, an upper logic level includes differential amplifiers arranged to provide a data capture circuit and a data latch output circuit. In addition, a lower logic level is coupled to the upper logic level and includes a differential amplifier having differential clock inputs to gate current through either the data capture circuit, during the transparent mode, or the data latch output circuit, during the latch mode, as a function of a CLOCK input signal.

Typically, the CLOCK input signal is transmitted as differential clock signals by a system clock source. The differential clock signals are distributed by the system clock source to the lower logic level of each of a plurality of latches arranged throughout a computer system. The system clock changes in a predetermined frequency from a first state to a second state, causing all of the latches coupled to the system clock source to alternate between the latch mode and the transparent mode.

In certain computer system designs, a clock enable circuit is coupled to each latch circuit so that preselected individual latches in the system can be controlled to continue to hold data irrespective of state changes in the system clock source, while other latches in the system continue to alternate between the latch and transparent modes under the control of the system clock source. The clock enable circuit of each latch includes an enable input arranged to control the enable circuit through the use of appropriate logic state signals that can be asserted at the enable input. Thus, logic signals can be used to either enable clock control or inhibit clock control of latch operation, as desired.

Each of the first and second states of the clock signal comprises a clock pulse of a predetermined time period. When the clock changes state from the first state to the second state and then back to the first state, the latch circuit would have to transition from the latch mode to the transparent mode, so that data at the input of the latch can be accepted by the latch, and then back to the latch mode to hold the data. The transition through the modes would have to occur within the time period of the clock pulse of the second clock state. Thus, as the speed of operation of the computer system increases, the time period available during the transparent mode, as determined by the second clock pulse, for each latch circuit to transition through the transparent mode to accept data, decreases. This is particularly true when the pulse of the second state of the clock is of shorter duration than the pulse of the first state of the clock, e.g. in the order of 250 pico seconds.

The speed of operation of a latch circuit is generally determined by the switching speeds of the transistors used in the latch circuit and the amount of electrical current used to drive the transistors. High currents help to discharge internal circuit capacitances such that the circuit generally operates at faster speeds. The switching speed of a transistor is a characteristic of the device and once a circuit designer selects the fastest transistor available for a particular implementation, the amount of current used to drive the transistors is the factor available for change, so as to further increase the speed of operation of the latch circuit. However, there must be a proper balancing between the power dissipation within a circuit caused by the use of high currents and the speed of operation of the circuit. Any trade-off between speed and power dissipation is ultimately limited by the delay-power characteristic of the process technology used to fabricate the latch circuit. The intrinsic delay-power characteristic is determined largely by the physical and electrical attributes of active and passive components that can be manufactured by a given process.

SUMMARY OF THE INVENTION

The present invention provides a new and improved ECL latch circuit of the type having a clock enable circuit for high speed performance. Pursuant to the invention, the latch circuit includes a switch circuit to controllably switch current from the clock enable circuit to the data capture circuit of the latch circuit during the transparent mode to provide additional current in the data capture circuit during the transparent mode for increased speed of operation. Generally, the switch circuit utilizes the clock signal to gate current from the enable circuit to the data capture circuit during the transparent mode. In this manner, current already available on a chip implementing the ECL latch circuit with clock enable is advantageously utilized during those times when the clock inhibit is not in use, to provide a higher current transparent mode operation in the latch circuit. Thus, the use of the clock enable circuit current improves the propagation delay to permit the latch circuit to operate properly with a smaller clock period for a given current supply available on the chip. When the enable circuit is operational to inhibit the clock signal control of the latch circuit, the switch circuit is also inhibited so that the current available for the enable circuit is gated to that circuit.

DETAILED DESCRIPTION

Figure 1:
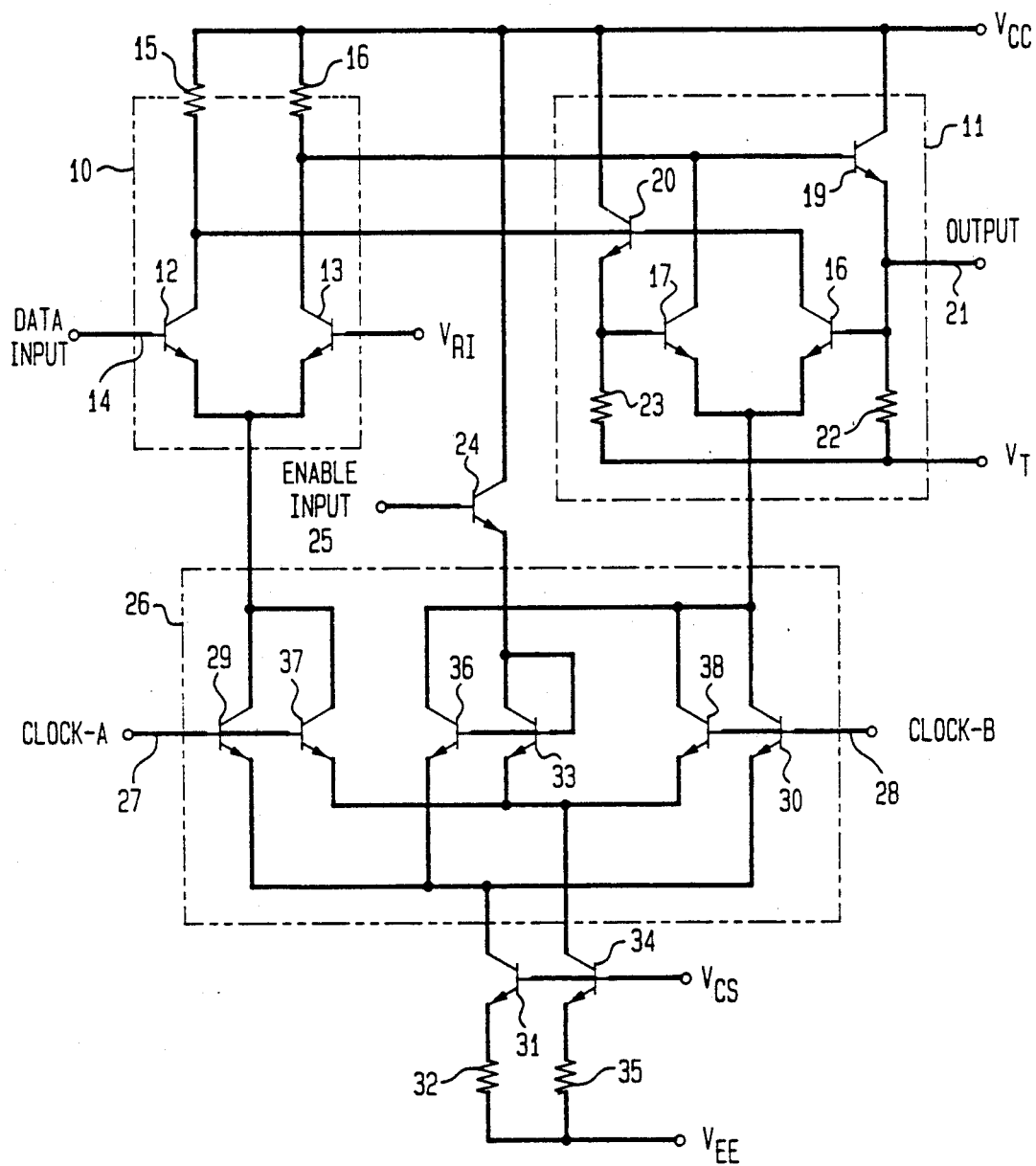
FIG. 1 is a schematic circuit diagram of an ECL latch circuit having a clock enable, according to the present invention.

Referring now to the drawings, and initially to FIG. 1, there is illustrated a latch circuit with clock enable, according to the present invention. The circuit includes a data capture circuit 10 and a data latch output circuit. The data capture circuit 10 comprises an emitter coupled logic design wherein the emitters of bipolar junction transistors 12, 13 are coupled together to provide a differential amplifier. The base of transistor 12 serves as a data input 14, while the base of the transistor 13 is coupled to a reference voltage source $V_{R1}$. The data input can receive either a high signal, e.g. −1.0 volts, or a low signal, e.g. −1.6 volts, which correspond to logical 1 and logical zero, respectively. The reference voltage is set to a predetermined level intermediate the high and low values of the data input signal, as for example −1.3 volts.

Pursuant to known circuit design, the differential amplifier formed by the transistors 12, 13 is biased so that the transistor 12, 13 having the more positive voltage applied to its base will draw all of the current flow through the data capture circuit 10 of the latch circuit. In this manner, transistor 12 will conduct all of the current when a high data value is input to the base thereof since −1.0 volts is more positive than the −1.3 reference voltage applied to the base of transistor 13. On the other hand, when a low data value is input to the base of transistor 12, all of the current in the data capture circuit 10 will flow through transistor 13 since the reference voltage value of −1.3 volts is more positive than the low data value of −1.6 volts.

The collectors of the transistors 12, 13 are coupled, via resistors 15, 16, respectively, to voltage source Vcc. The collectors of the transistors 12, 13 are also coupled to the data latch output circuit 11 of the latch, as follows.

The data latch output circuit 11 comprises a positive feedback loop amplifier including emitter coupled transistors 17, 18. The collector of transistor 17 is coupled to the collector of transistor 13 and to the base of a transistor 19. The collector of transistor 18 is coupled to the collector of transistor 12 and to the base of a transistor 20. The collector of each of transistors 19, 20 is coupled to the voltage source Vcc. The emitter of transistor 19 is coupled to an output 21 of the latch, to the base of transistor 18 and, via a resistor 22, to a voltage source Vt. In addition, the emitter of transistor 20 is coupled to the base of transistor 17 and, via a resistor 23, to the voltage source Vt.

In accordance with known circuit design, the transistors 17-20 can be biased by the voltage sources Vcc and Vt and the resistors 22, 23 so that the data value applied to the input 14 appears at the output 21 when the data capture circuit 10 is in a conducting state, i.e. the latch is in the transparent mode, due to the coupling of the collector of transistor 12 to the base of transistor 20 and the coupling of the collector of transistor 13 to the base of transistor 19. Moreover, when the data capture circuit 10 is switched to a non-conducting state, corresponding to the latch mode of the latch, the circuit formed by the transistors 17-20 holds the output 21 at the value of the data applied to the input 14 during the previous transparent mode clock pulse of the latch.

The data capture circuit 10 and the data latch output circuit 11 of the latch are referred to as the upper logic level of the latch and the data input and output signals at 14 and 21 are referred to as upper logic level signals. In the circuit illustrated in FIG. 1, an enable transistor 24 is provided so that an enable signal generated at the upper logic level of the computer system coupled to the latch can be applied to inhibit clock control of the latch. To that end, an enable input 25 is coupled to the base of the enable transistor 24. The collector of the enable transistor 24 is coupled to the voltage source Vcc.

The transition of the latch between the transparent and latch modes is typically controlled by clock signals applied to a lower level logic 26 of the latch. The lower level logic 26 is also arranged as a differential amplifier so that two clock signals, CLOCK A and CLOCK B, can be input to the lower level logic 26 to gate current flow through either the data capture circuit 10 or the data latch output circuit 11 of the upper logic level of the latch. For example, CLOCK A corresponds to the transparent mode of latch operation and will be more positive than CLOCK B during data capture. CLOCK B will be more positive than CLOCK A when the latch is to be held in the latch mode. Each of CLOCK A and CLOCK B can be switched from high to low periodically pursuant to a predetermined frequency and are inverted from one another so that when CLOCK A is high, CLOCK B is low and vice versa. In this manner, the latch can be controlled to alternate between the transparent and latch modes, as discussed above.

Referring once again to FIG. 1, the lower level logic 26 includes transistors 29, 30 having emitters coupled to one another and to the collector of a transistor 31. The emitter coupled transistors 29, 30 form a differential amplifier. The emitter of the transistor 31 is coupled, via a resistor 32 to a voltage source Vee. The base of the transistor 31 is coupled to a voltage source Vcs arranged to bias transistor 31 to be in a conducting state and thus act as a current source to one or the other of transistors 29, 30.

The collector of transistor 29 is coupled to the emitters of transistors 12, 13. The collector of transistor 30 is coupled to the emitters of transistors 17, 18. Moreover, the CLOCK A input 27 is coupled to the base of transistor 29 and the CLOCK B input 28 is coupled to the base of transistor 30. Accordingly, the current of the current source provided by transistor 31 will be gated through either one of the data capture circuit 10 or the data latch output circuit 11 depending on the differential between the CLOCK A and CLOCK B signals at the inputs 27, 28, respectively.

For example, when CLOCK A is high or more positive than CLOCK B, transistor 29 will be switched to a conducting state to gate the current provided by transistor 31 through the data capture circuit 10 of the latch so that the logical signal at the data input 14 is captured and transmitted to the output 21. When the clocks switch and CLOCK B is high and CLOCK A is low, transistor 30 will gate the current through the data latch output circuit 11 of the latch and the logical signal at the input 14 during the previous CLOCK A high/ CLOCK B low state will remain at the output 21. A new logical signal applied to input 14 will not be captured unless the clock signals again switch to CLOCK A high and CLOCK B low.

In order to inhibit the clock signal control of the latch, the emitter of enable transistor 24 is coupled to each of the collector and the base of a transistor 33 arranged in the lower level logic 26. The emitter of transistor 33 is coupled to the collector of transistor 34. Transistor 34 provides a current source for the enable circuit including transistor 24 and its associated transistor 33. To that end, the emitter of transistor 34 is coupled to the voltage source Vee via a resistor 35. Moreover, the base of transistor 34 is coupled to the voltage source Vcs to bias transistor 34 into a conducting state.

When it is desired to inhibit clock signal control of the latch, an appropriate upper logic enable signal is applied to the base of enable transistor 24 to switch enable transistor 24 into a conducting state that is suitable to switch on transistor 33 via the coupling of the emitter of enable transistor 24 to the base of transistor 33. The base of transistor 33 is also coupled to the base of a lower logic level enable transistor 36 that is coupled in parallel to transistor 30. More specifically, the collector of the lower logic level transistor 36 is coupled to the collector of transistor 30 and the emitter of transistor 36 is coupled to the emitter of transistor 30. When the enable transistor 24 is switched on by a high upper level input signal at the enable input 25, the lower logic level enable transistor 36 will also be switched on due to the coupling between the emitter of the enable transistor 24 and the base of the lower level logic enable transistor 36.

The coupling between the lower logic level transistor 36 and the transistor 33 serves to shift the effect of the upper logic level enable signal to the lower logic level in order to properly affect the lower logic level clock control of current flow through the upper logic level circuitry. The current source provided by transistor 34 is necessary to implement the level translation from the upper logic level enable signal applied to the base of the enable transistor 24 and the lower level logic 26. However, in known ECL latch design, the current provided by transistor 34, while necessary for the proper functioning of the enable circuit, does not contribute to the speed of operation of the data capture circuit 10.

The differential circuit formed by the parallel transistors 30, 36, on the one hand, and the transistor 29 on the other hand, will gate current from transistor 31 through one of the data capture circuit 10 or the data latch output circuit depending on which of the transistors 29, 30, 36 has the most positive signal applied to its base, i.e. CLOCK A, CLOCK B or the enable signal applied by the emitter of enable transistor 24 to the base of the lower logic level enable transistor 36.

The CLOCK A and CLOCK B signals are each switched between high and low values having a relatively small differential, for example, in the order of 300 mv (between −2.0 to −2.3 volts). However, the effect of the enable signal is to apply a voltage to the base of the lower logic level transistor 36 that ranges between −1.7 and −2.3 volts. Thus, when the larger enable signal on the base of transistor 36 is at its most positive value of −1.7 volts, it will be more positive than the −2.0 volt most positive value of the CLOCK A signal and cause the current flow to continue through the data latch output circuit 11 irrespective of a high or low CLOCK A signal. This will have the effect of disabling clock signal control of the latch and maintain the latch in the latch mode for as long as the more positive enable signal is asserted at the base of the enable transistor 24.

Pursuant to a feature of the present invention, a transistor 37 is arranged so that its emitter is coupled to the collector of the enable circuit current source transistor 34 and its collector is coupled to the collector of transistor 29. Moreover, the base of transistor 37 is coupled to the CLOCK A input 27. Likewise, a transistor 38 is arranged so that its emitter is coupled to the collector of the enable circuit current source transistor 34 and its collector is coupled to the collector of transistor 30. The base of transistor 38 is coupled to the CLOCK B input 28. In this manner, the current provided by transistor 34 can be gated through either the data capture circuit 10 or the data latch output circuit 11 via the transistors 37, 38, under the control of the CLOCK A and CLOCK B signals, as will now be described.

As shown in FIG. 1, the transistors 33, 37 and 38 form another differential amplifier wherein the current flow provided by the enable current source transistor 34 is caused to flow through the transistor 33, 37 or 38 having the most positive voltage applied to its base.

Transistor 33 will gate all of the current from the transistor 34 through enable transistor 24 so long as the −1.7 volt high enable signal at the emitter of transistor 24 is applied to the base of transistor 33 since −1.7 volts is more positive than the −2.0 volt most positive voltage of either of the CLOCK A or CLOCK B signals.

Accordingly, the high enable input will override clock control of the differential amplifier formed by transistors 33, 37, 38, as well as the differential amplifier formed by transistors 29, 30, 36. In this manner, the latch remains in the latch mode with the current of the enable circuit current source transistor 34 properly gated to the enable transistor 24, via transistor 33, and the current provided by the transistor 31 properly gated to the data latch output circuit 11 via transistor 36.

However, when the enable input signal is at its low value of −1.6 volts, with a corresponding −2.3 volts low at the emitter of transistor 24, the clock signal CLOCK A, CLOCK B having the most positive voltage (−2.0 volts) will control the flow of current from transistor 34 to either the data capture circuit 10 or the data latch output circuit 11, respectively, via the appropriate one of transistors 37, 38. Thus, the additional current provided by the enable circuit current source transistor 34 is gated to the data capture circuit 10 when CLOCK A is high and the enable signal is low. Of course, the current provided by transistor 31 is also gated to the data capture circuit 10 via transistor 29 when CLOCK A is high and the enable signal is low, so that current from both of the current sources available within the latch is directed to the data capture circuit 10 to increase the speed of operation of the data capture circuit 10 during the transparent mode caused by the CLOCK A high signal. This will enable the latch to function properly under reasonable load conditions when the time period of CLOCK A high is reduced to a narrow pulse time which approaches the signal propagation delay through the latch.

In the embodiment of the present invention illustrated in FIG. 1, the additional current of transistor 34 is also gated to the data latch output circuit by transistor 38 when CLOCK B is high and the enable signal is low.

Figure 2:
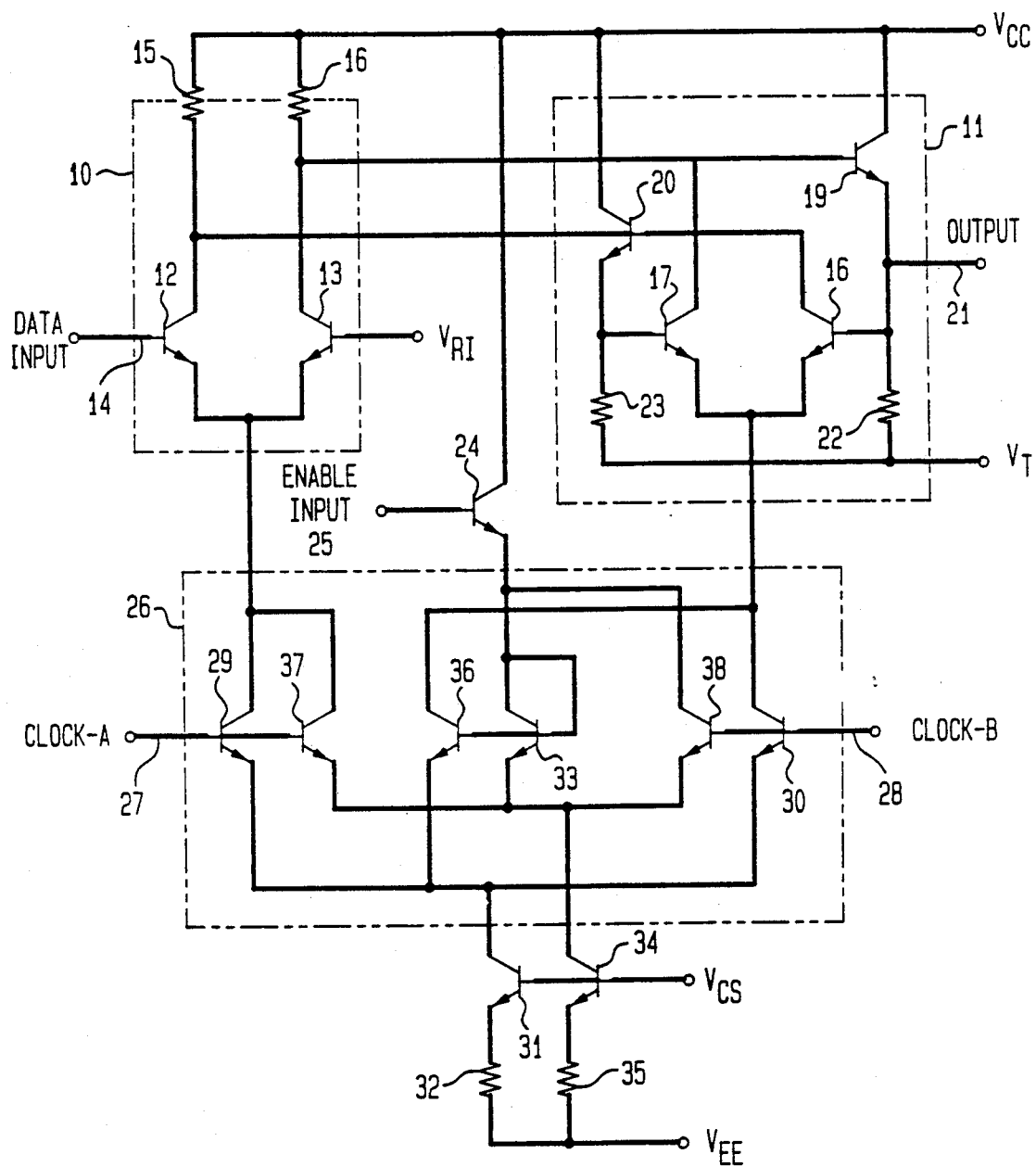
FIG. 2 is a schematic circuit diagram of an ECL latch circuit according to another embodiment of the present invention.

Referring now to FIG. 2, there is illustrated another embodiment of the present invention. The latch circuit of FIG. 2 is identical to the circuit illustrated in FIG. 1, except that the collector of transistor 38 is coupled to the emitter of enable transistor 24 rather than to the collector of transistor 30. In this manner, the current provided by transistor 34 is not gated to the data latch output circuit 11 when CLOCK B is high and the enable signal is low. In a dc steady state analysis of the circuit of FIG. 2, with the data input 14 low, the output signal at the output 21 will be lower during the transparent mode than during the latch mode since the additional current provided by transistor 34 is gated to the data capture circuit 10 when CLOCK A is high and the enable signal is low, as described above with respect to FIG. 1.

However, if the pulse period of the CLOCK A high signal is on the same order as the latch's propagation delay time, the improved speed of operation of the data capture circuit 10 during the transparent mode will be obtained without any noticeable effect on the output signal level.

Figure 3:
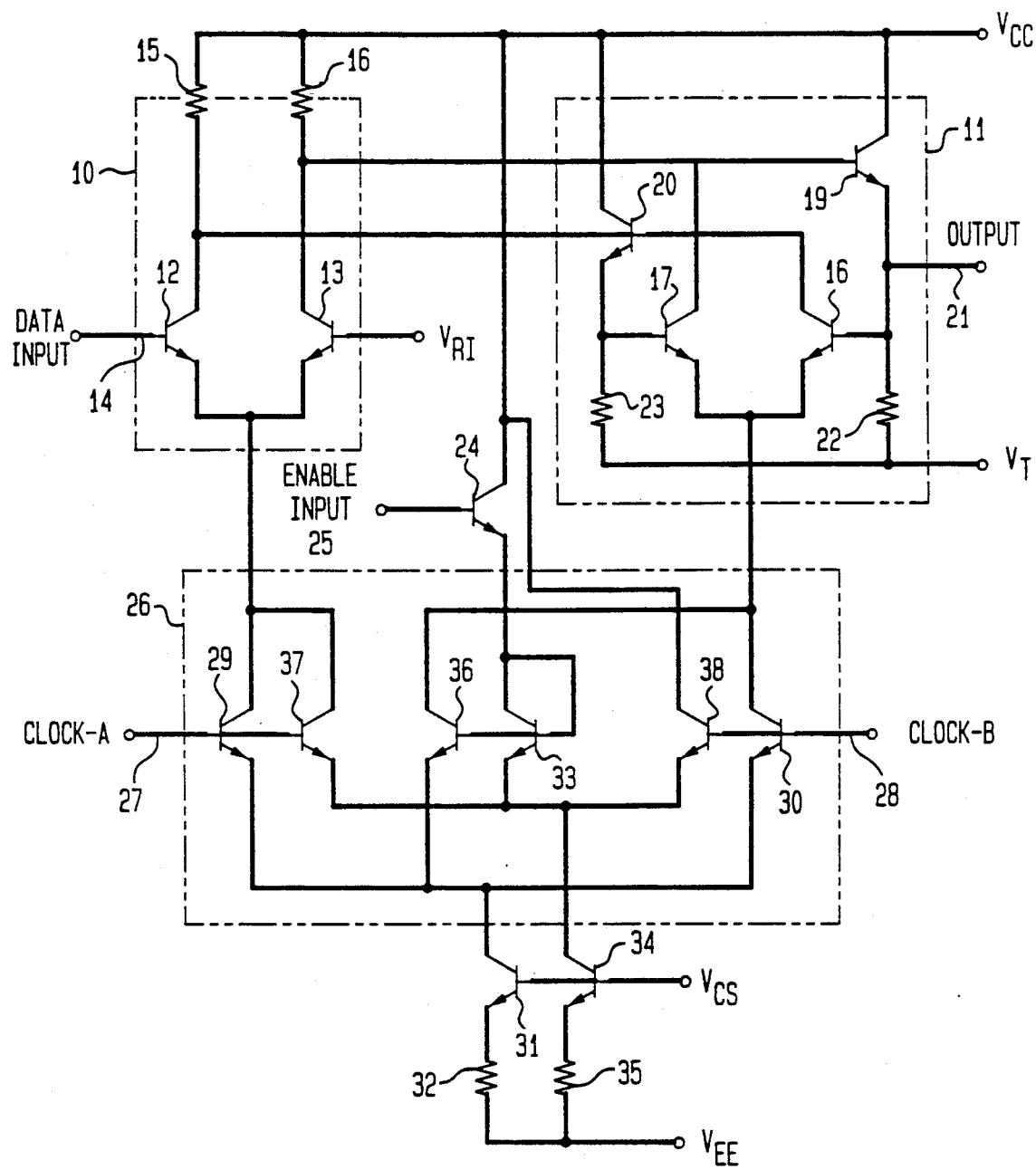
FIG. 3 is a schematic circuit diagram of an ECL latch circuit according to a further embodiment of the present invention.

Referring now to FIG. 3, in yet another embodiment of the present invention, the collector of transistor 38 is coupled to the collector of the enable transistor 24. The latch circuit of FIG. 3 operates in a similar manner as the latch circuit of FIG. 2 except that when the enable signal is low and CLOCK B is high, the current provided by transistor 34 is no longer directed through the enable transistor 24. Rather, the current is pulled directly out of the voltage supply Vcc. This will provide a higher impedance enable input 25 when the enable signal is low.

What is claimed is:

1. An ECL latch with clock enable, which comprises:
a data capture circuit;
a data latch output circuit coupled to said data capture circuit;
a first current source coupled to each of said data capture circuit and said data latch output circuit;
a clock circuit coupled to each of said data capture circuit, said data latch output circuit and said first current source to controllably, periodically gate current from said first current source through one and then the other of said data capture circuit and said data latch output circuit;
a clock enable circuit having an input and being coupled to said clock circuit to controllably inhibit said clock circuit so that current from said first current source is gated to said data latch output circuit only, when a predetermined enable signal is applied to said input;
a second current source coupled to each of said clock enable circuit and said data capture circuit; and
a current switch circuit coupled between said second current source, said clock enable circuit and said data capture circuit to controllably gate current from said second current source to one or the other of said data capture circuit and said clock enable circuit;
wherein said current switch circuit gates current from said second current source to said clock enable circuit when the predetermined enable signal is applied to said input and gates current from said second current source to said data capture circuit when said clock circuit gates current from said first current source to said data capture circuit.

2. An ECL latch with clock enable, which comprises:
an upper logic level including a data capture circuit, a data latch output circuit and a clock enable circuit, all coupled in a parallel circuit arrangement relative to one another;
a first current source;
a second current source; and
a lower logic level comprising a first differential amplifier and a second differential amplifier;
said first differential amplifier having two clock inputs and being coupled to each of said first current source, said data capture circuit, said data latch output circuit and said clock enable circuit;
said two clock inputs adapted to receive differential clock signals to cause said first differential amplifier to controllably, periodically gate current from said first current source to one and then the other of said data capture circuit and said data latch output circuit;
said first differential amplifier being further controlled by said clock enable circuit to inhibit the differential clock signal control of said first differential amplifier so as to gate current from said first current source to said data latch output circuit only, when a predetermined enable signal is applied to said clock enable circuit;
said second differential amplifier having two current switch inputs adapted to receive the differential clock signals and being coupled to each of said second current source, said clock enable circuit and said data capture circuit;
said second differential amplifier being controllable by said clock enable circuit to gate current from said second current source to said clock enable circuit, when the predetermined clock enable signal is applied to said clock enable input;
said second differential amplifier being controllable by the differential clock signals to gate current from said second current source to said data capture circuit when the differential clock signals gate current from said first current source to said data capture circuit.

3. The ECL latch of claim 2, wherein said second differential amplifier is further coupled to said data latch output circuit and controllable by the differential clock signals to gate current from said second current source to said data latch output circuit when the differential clock signals gate current from said first current source to said data latch output circuit.

4. The ECL latch of claim 3, wherein:
said first differential amplifier comprises:
 i) a first set of three emitter coupled transistors, said coupled emitters being coupled to said first current source;
 ii) a collector of a first one of said first set of three emitter coupled transistors being coupled to said data capture circuit;
 iii) a collector of a second one of said first set of three emitter coupled transistors being coupled to said data latch output circuit;
 iv) a collector of a third one of said first set of three emitter coupled transistors being coupled to said data latch output circuit;
 v) a base of each of said first one and said third one of said first set of three emitter coupled transistors being adapted to receive the differential clock signals;
 vi) a base of said second one of said first set of three emitter coupled transistors being coupled to said clock enable circuit; such that current from said first current source is gated to one and then the other of said data capture circuit and said data latch output circuit via said first one and said third one of said first set of three emitter coupled transistors under control of the differential clock signals and is gated to said data latch output circuit only via said second one of said first set of three emitter coupled transistors under control of said clock enable circuit when the predetermined clock enable signal is applied to said clock enable circuit; and said second differential amplifier comprises:
i) a second set of three emitter coupled transistors, said coupled emitters being coupled to said second current source;
ii) a collector of a first one of said second set of three emitter coupled transistors being coupled to said data capture circuit;
iii) a collector of a second one of said second set of three emitter coupled transistors being coupled to said clock enable circuit;
iv) a collector of a third one of said second set of three emitter coupled transistors being coupled to said data latch output circuit;
v) a base of each of said first one and said third one of said second set of three emitter coupled transistors being adapted to receive the differential clock signals;
vi) a base of said second one of said second set of three emitter coupled transistors being coupled to said clock enable circuit; such that current from said second current source is gated to one and then the other of said data capture circuit and said data latch output circuit via said first one and said third one of said second set of three emitter coupled transistors under control of the differential clock signals and is gated to said clock enable circuit via said second one of said second set of three emitter coupled transistors under control of said clock enable circuit when the predetermined clock enable signal is applied to said clock enable circuit.

5. The ECL latch of claim 2, wherein:
said first differential amplifier comprises:
i) a first set of three emitter coupled transistors, said coupled emitters being coupled to said first current source;
ii) a collector of a first one of said first set of three emitter coupled transistors being coupled to said data capture circuit;
iii) a collector of a second one of said first set of three emitter coupled transistors being coupled to said data latch output circuit;
iv) a collector of a third one of said first set of three emitter coupled transistors being coupled to said data latch output circuit;
v) a base of each of said first one and said third one of said first set of three emitter coupled transistors being adapted to receive the differential clock signals;
vi) a base of said second one of said first set of three emitter coupled transistors being coupled to said clock enable circuit; such that current from said first current source is gated to one and then the other of said data capture circuit and said data latch output circuit via said first one and said third one of said first set of three emitter coupled transistors under control of the differential clock signals and is gated to said data latch output circuit only via said second one of said first set of three emitter coupled transistors under control of said clock enable circuit when the predetermined clock enable signal is applied to said clock enable circuit; and said second differential amplifier comprises:
i) a second set of three emitter coupled transistors, said coupled emitters being coupled to said second current source;
ii) a collector of a first one of said second set of three emitter coupled transistors being coupled to said data capture circuit;
iii) a collector of a second one of said second set of three emitter coupled transistors being coupled to said clock enable circuit;
iv) a collector of a third one of said second set of three emitter coupled transistors being coupled to said clock enable circuit;
v) a base of each of said first one and said third one of said second set of three emitter coupled transistors being adapted to receive the differential clock signals;
vi) a base of said second one of said second set of three emitter coupled transistors being coupled to said clock enable circuit; such that current from said second current source is gated to one and then the other of said data capture circuit and said clock enable circuit via said first one and said third one of said second set of three emitter coupled transistors under control of the differential clock signals and is gated to said clock enable circuit via said second one of said second set of three emitter coupled transistors under control of said clock enable circuit when the predetermined clock enable signal is applied to said clock enable circuit.

6. The ECL latch of claim 5, wherein:
said clock enable circuit comprises a clock enable transistor arranged in said upper logic level and including an emitter coupled to said lower logic level and a collector coupled to a voltage supply;
said collector of said third one of said second set of three emitter coupled transistors being coupled to said emitter of said clock enable transistor.

7. The ECL latch of claim 5, wherein:
said clock enable circuit comprises a clock enable transistor arranged in said upper logic level and including an emitter coupled to said lower logic level and a collector coupled to a voltage supply;
said collector of said third one of said second set of three emitter coupled transistors being coupled to said collector of said clock enable transistor.

8. In an ECL latch with clock enable having a data capture circuit, a data latch output circuit coupled to said data capture circuit, a first current source coupled to each of said data capture circuit and said data latch output circuit, a clock circuit to control and periodically gate current from the first current source through one and then the other of the data capture circuit and the data latch output circuit, a clock enable circuit to controllably inhibit the clock circuit and a second current source to provide current to the clock enable circuit, an improvement which comprises:
a current switch coupled between the second current source, the clock enable circuit and the data capture circuit, wherein said current switch gates current from the second current source to the data capture circuit when the clock circuit gates current from the first current source to the data capture circuit.

9. A method of operating an ECL latch with clock enable, comprising the steps of:

providing a first current source for the ECL latch;

providing a second current source for the clock enable;

gating current from the first current source to the ECL latch to cause the ECL latch to periodically capture and then latch data under control of a clock signal;

utilizing the clock enable with current from the second current source to selectively inhibit clock signal control of the gating of current from the first current source; and switching current from the second current source to the ECL latch when the clock signal is gating current from the first current source to the ECL latch to cause the ECL latch to periodically capture and then latch data.

* * * * *